United States Patent
Pei

(10) Patent No.: US 8,293,081 B2
(45) Date of Patent: Oct. 23, 2012

(54) PHYSICAL VAPOR DEPOSITION DEVICE

(75) Inventor: Shao-Kai Pei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 388 days.

(21) Appl. No.: 12/699,988

(22) Filed: Feb. 4, 2010

(65) Prior Publication Data

US 2010/0288630 A1    Nov. 18, 2010

(30) Foreign Application Priority Data

May 15, 2009  (CN) .......................... 2009 1 0302333

(51) Int. Cl.
*C23C 14/00*  (2006.01)
*C23C 16/00*  (2006.01)
*C25B 11/00*  (2006.01)
*C25B 13/00*  (2006.01)

(52) U.S. Cl. ......... 204/298.28; 204/298.23; 204/298.29; 118/729

(58) Field of Classification Search ............ 204/298.28, 204/298.23, 298.29

See application file for complete search history.

(56) References Cited

U.S. PATENT DOCUMENTS

| | | | | |
|---|---|---|---|---|
| 3,483,114 A * | 12/1969 | Froemel et al. | .......... | 204/298.12 |
| 6,416,640 B1 * | 7/2002 | Schertler | ............... | 204/298.25 |
| 6,471,837 B1 * | 10/2002 | Hans et al. | ............... | 204/298.41 |
| 6,761,772 B2 * | 7/2004 | Giacri et al. | ................... | 118/730 |
| 8,241,473 B2 * | 8/2012 | Wang | ..................... | 204/298.15 |
| 2009/0065348 A1 * | 3/2009 | Fujii | ........................ | 204/192.11 |
| 2010/0276283 A1 * | 11/2010 | Muenz et al. | ............ | 204/298.14 |

* cited by examiner

*Primary Examiner* — Jill Warden
*Assistant Examiner* — Charles D Hammond
(74) *Attorney, Agent, or Firm* — Altis Law Group, Inc.

(57) ABSTRACT

A physical vapor deposition device includes a chamber; a cathode and an opposite anode, a target material, and supporting device arranged in the chamber. The target material and the supporting device are positioned between the cathode and the anode. The supporting device includes a rotatable device and a hollow supporting plate. The hollow supporting plate is configured for securing the workpiece and exposing part of the workpiece where is needed to be coated. The hollow supporting plate is movably fastened to the rotatable device. A distance from the hollow supporting plate to the rotatable device can be adjusted when the hollow supporting plate is rotated together with the rotatable device in order to align workpiece with the target material.

17 Claims, 4 Drawing Sheets

PHYSICAL VAPOR DEPOSITION DEVICE

BACKGROUND

1. Technical Field

The present disclosure relates to physical vapor deposition device.

2. Description of Related Art

Physical vapor deposition is a process of vaporizing target materials supported on a crucible and coating a film on a workpiece by the vaporized target material.

A typical physical vapor deposition device includes a vacuum container, a support member, and a crucible. The support member is fixed on an inner surface of the vacuum container by threaded screws and positioned above the crucible. In coating, when a lot of workpieces such as mobile-phone shells that are positioned around a target material are needed to be coated simultaneously, considering the space limitation of the vacuum container, it is difficult for us to arrange the workpieces in such a manner that each of the workpieces is just aligned with the target material and opposite to the target material. Thus, it is hard to coat each workpiece and form a film with an identical thickness on each workpiece.

Therefore, a new physical vapor deposition device is desired to overcome the above-described shortcoming.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Figure 1:
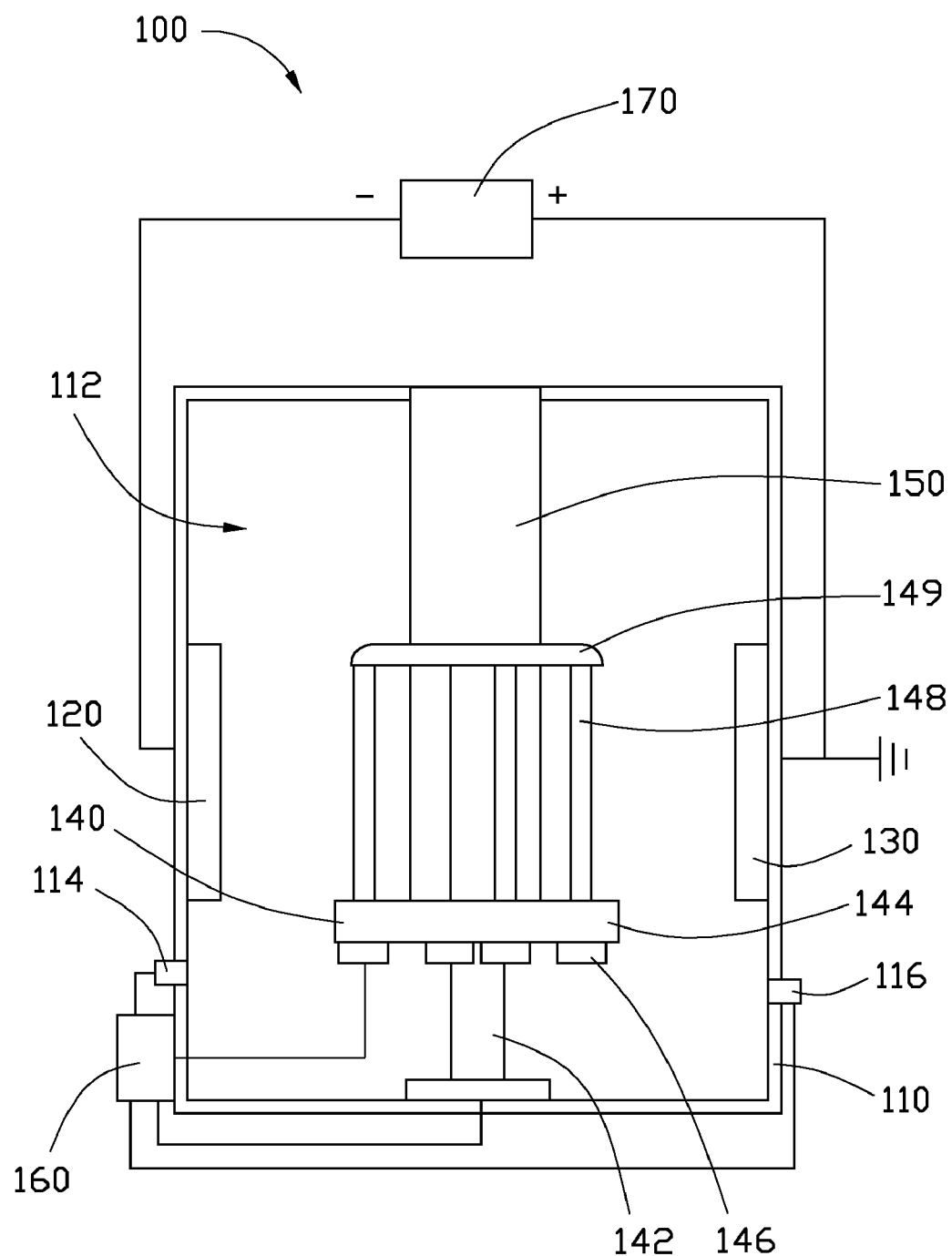
FIG. 1 is schematic, side view of a physical vapor deposition device according to one embodiment.

Reference will now be made to the drawings to describe various inventive embodiments of the present disclosure in detail, wherein like numerals refer to like elements throughout.

Referring to FIGS. 1 to 4, a physical vapor deposition device 100 for coating workpieces (only one workpiece is shown) 200 according to one embodiment of present disclosure is shown. The physical vapor deposition device 100 includes a chamber 110, a cathode 120, an anode 130, a supporting device 140, a target material 150, a controller 160 and a power supply device 170.

The chamber 110 is grounded and made of metal materials. A space 112 is defined in the chamber 110 for accommodating the workpieces 200, the cathode 120, the anode 130, the supporting device 140, and the target material 150. The physical vapor deposition device 100 further includes a vacuum device 114 and a gas supply device 116. In one embodiment, the vacuum device 114 is a vacuum air pump configured to vacuumize the space 112. The gas supply device 116 is configured to introduce inert gases such as argon and xenon into the chamber 110.

The cathode 120 and the anode 130 are formed on an internal cylinder wall of the chamber 110 and arranged to be on opposite sides of the internal cylinder wall 144.

The supporting device 140 is positioned between the cathode 120 and the anode 130 and includes a first driving device 142, a rotatable device 144, four second driving devices 146, four supporting poles 148, and a hollow supporting plate 149. In an alternative embodiment, the number of the second driving devices 146 are three.

Figure 3:
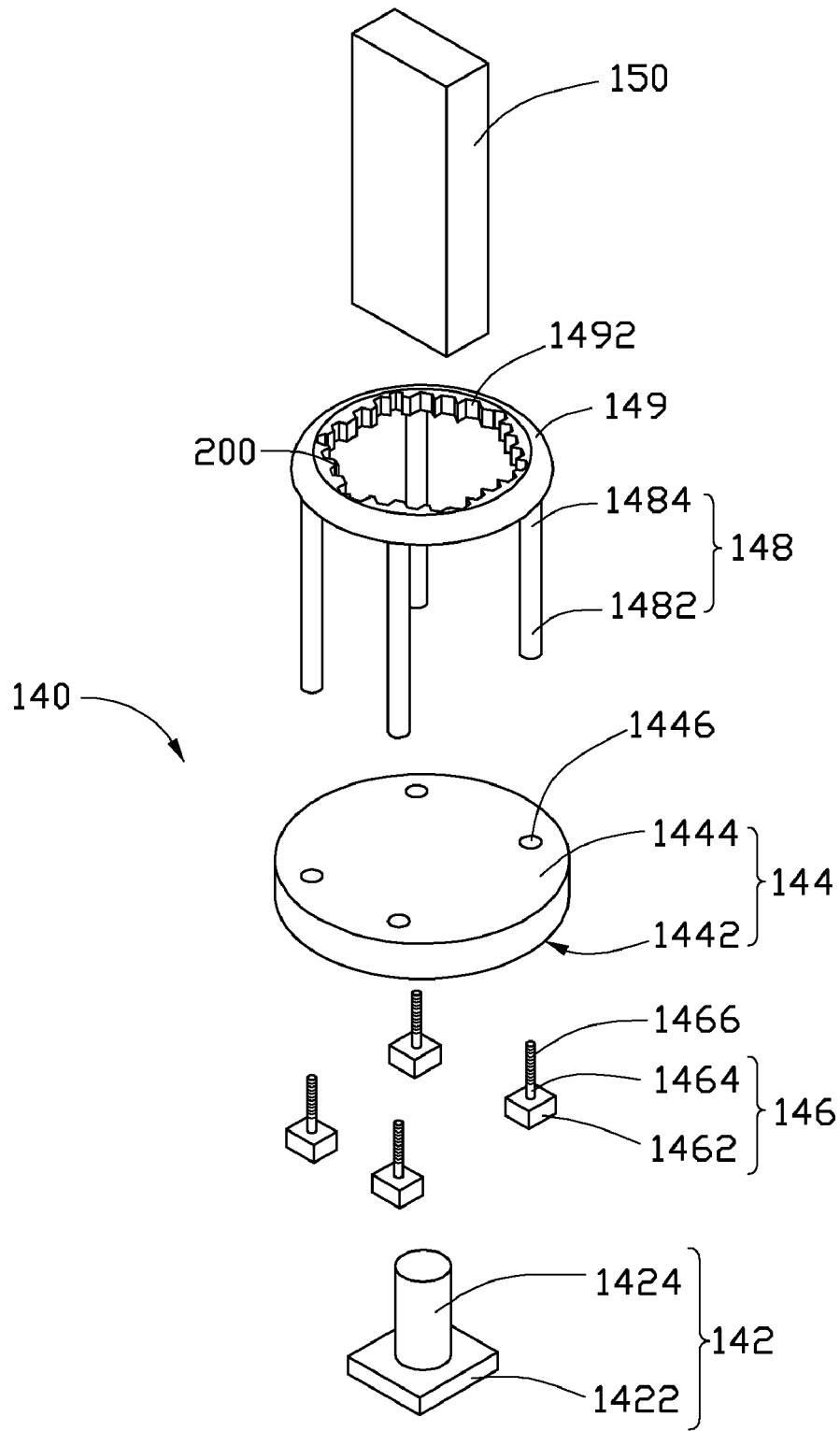
FIG. 3 is a partial exploded view of the physical vapor deposition device of FIG. 1.
Figure 4:
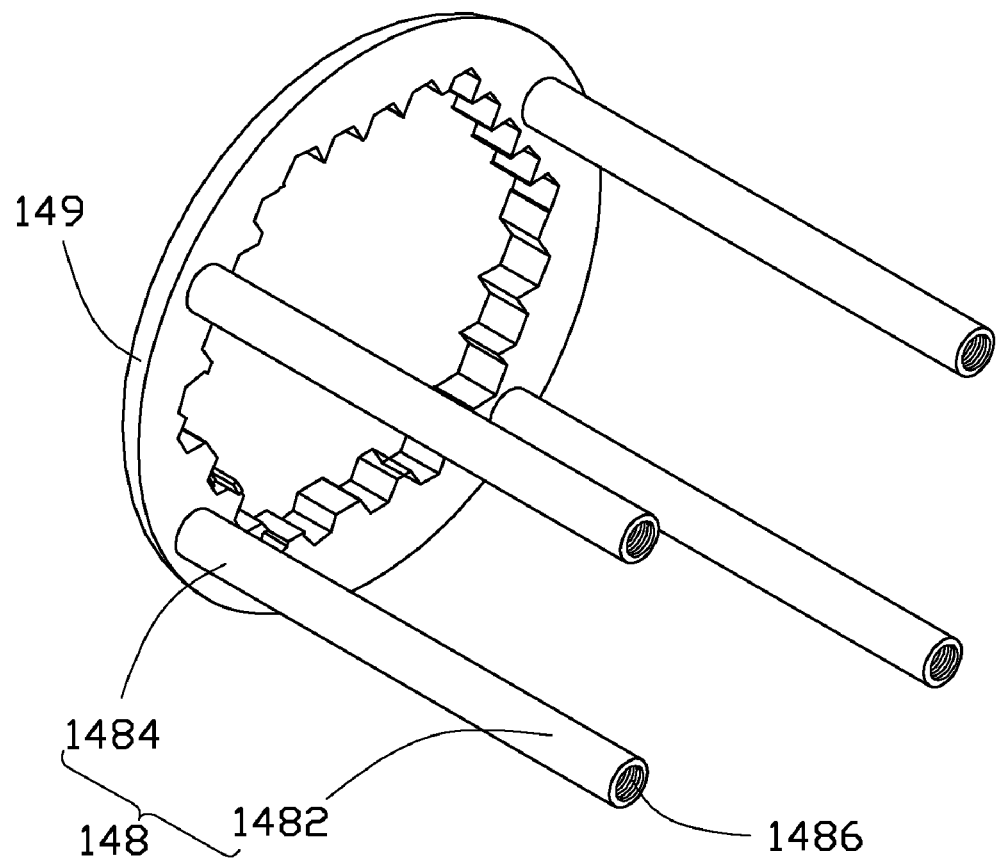
FIG. 4 is a partial perspective view of the physical vapor deposition device of FIG. 1 in a different view angle.

The first driving device 142 includes a first driving body 1422 and a rotatable first shaft 1424 extending from the first driving body 1422 as shown in FIG. 3. Each second driving device 146 includes a second driving body 1462 and a rotatable second shaft 1464 extending from the second driving body 1462. In one embodiment, the first driving device 142 and the second driving device 142 are motors.

Referring to FIG. 3, in one embodiment, the rotatable device 144 has a disc-shaped configuration and includes a first surface 1442 and a second surface 1444. The first surface 1442 and the second surface 1444 are on opposite sides of the rotatable device 144. Four restricting through holes 1446 are defined in the rotatable device 144 and each extends from the first surface 1442 to the second surface 1444. The four restricting through holes 1446 are positioned along a circumference of the rotatable device 144 and arranged symmetrically according to a center of the rotatable device 144. A center of the first surface 1442 of the rotatable device 144 is fastened to an end of the first shaft 1424. The rotatable device 144 is rotatable by the first shaft 1424 around first shaft 1424 as shown in FIG. 1.

The second driving bodies 1462 of the four second driving devices 146 are aligned with the four restricting through holes 1446 correspondingly and fastened to the first surface 1442 of the rotatable device 144. The four second shafts 1464 of the four second driving devices 146 are accommodated in the four restricting through holes 1446 correspondingly. Each second shaft 1464 includes screw thread 1466 formed on its distal part.

Each supporting pole 148 includes a first end 1482 defining a screw hole 1486, and an opposite second end 1484 fastened to the hollow supporting plate 149. A diameter of each supporting pole 148 is slightly shorter than a diameter of each restricting through hole 1446 so as to facilitate the four supporting poles 148 to be movably accommodated in the four restricting through holes 1446, correspondingly. The four second shafts 1464 are threaded into the screw holes 1486 of the four supporting poles 148, respectively. The supporting poles 148 together with the hollow supporting plate 149 can be moved up and down along a direction perpendicularly to the second surface 1444 of the rotatable device 144 when the second shafts 1464 are rotated by the second driving bodies 1462 as shown in FIG. 1.

Figure 2:
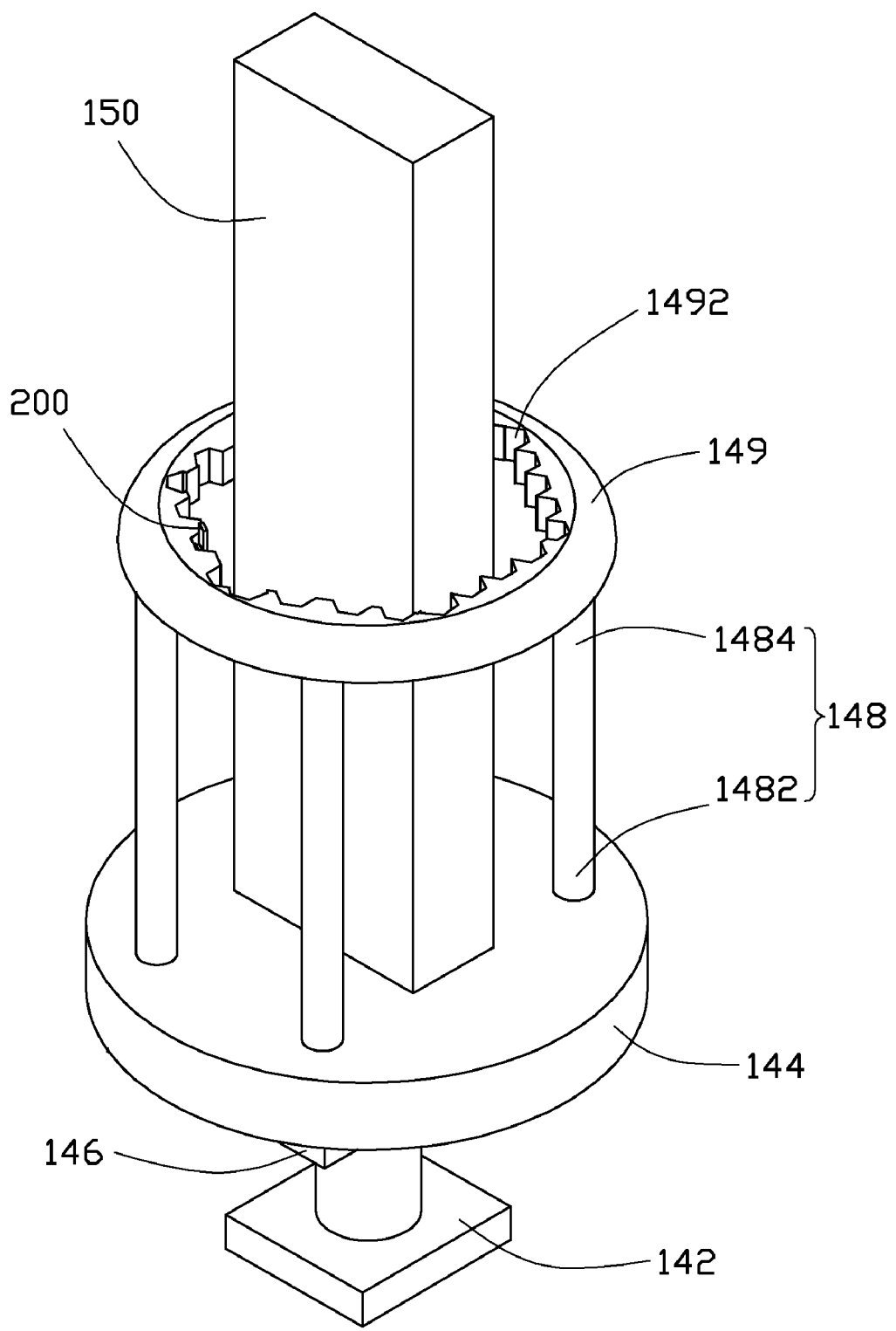
FIG. 2 is a partial perspective view of the physical vapor deposition device of FIG. 1.

The hollow supporting plate 149 is circular or annular defining a plurality of notches 1492. The plurality of notches 1492 are arranged along a circumference of an internal sidewall of the hollow supporting plate 149 and configured to receive the workpieces 200 correspondingly as shown in FIG. 2. In one embodiment, the workspieces 200 are attached and fastened to the hollow supporting plate 149 when a middle part of each workspiece 200 is received in one notch 1492. In an alternative embodiment, each workspiece 200 includes a first magnetic part with positive polarity and the hollow supporting plate 149 includes a second magnetic part with negative polarity. Thus, the workspieces 200 are attached into the notches of the hollow supporting plate 149 by the magnetic attraction force.

The target material 150 is upright arranged between the cathode 120 and the anode 130 as shown in FIG. 1. One end of the target material 150 is fastened to the top of the chamber 110 over the rotatable device 144. The other end of the target material 150 passes through the hollow supporting plate 149 so that a middle part of the target material 150 faces the workspieces 200. In one embodiment, the target material 150 has an elongated cubic shape or a columnar shape and extends along a direction perpendicular to the hollow supporting plate 149.

The power supply device 170 and the controller 160 are positioned outside the chamber 110. The power supply device 170 are electrically coupled to the controller 160, the vacuum device 114, the gas supply device 116, the first driving device 142, and the four second driving device 146 for providing operation voltages to them. The power supply device 170 is further electrically connected to the cathode 120 and the anode 130 and configured for providing a high voltage of about several thousands volts across the cathode 120 and the anode 130. The controller 160 is used to control a first process, a second process, a third process, and a fourth process. The first process controls the vacuum device 114 to vacuumize the space 112 of the chamber 110. The second process controls the gas supply device 116 to introduce inert gases into the space 112 of the chamber 110. The third process controls the first driving device 142 to rotate the first shaft 1424. The fourth process controls the second driving devices 146 to rotate the second shafts 1464.

To coat the workspieces 200, the vacuum device 114 vacuumizes the space 112 of the chamber 110. The gas supply device 116 introduces argon into the space 112 of the chamber 110. The power supply device 170 provides the high voltage across the cathode 120 and the anode 130 to ionize the argon. The argon ions are moved along a direction from the anode 130 to the cathode 120 by a electric field generated by the high voltage, thereby crashes a surface of the target material 150. The high speed argon ions collide with the atoms of the target material 150. As a result, the atoms of the target material 150 become scattered and deposit on a surface of each workspiece 200 to form a coating film.

Because hollow supporting plate 149 together with the supporting poles 148 of the supporting device 140 can be driven by the first and second driving device 142, 146 to rotate around the target material 150 and move up and down along the target material 150 as shown in FIG. 1, the positions of the workspieces 200 attached to the hollow supporting plate 149 can be adjusted to substantially face the target material 150. Thus, the coating film formed on workspieces 200 has a uniform thickness.

It is to be understood, however, that even though numerous characteristics and advantages of certain inventive embodiments have been set out in the foregoing description, together with details of the structures and functions of the embodiments, the disclosure is illustrative only; and that changes may be made in detail, especially in matters of arrangement of parts within the principles of present invention to the full extent indicated by the broad general meaning of the terms in which the appended claims are expressed.

What is claimed is:

1. A physical vapor deposition device for coating a workpiece, comprising:
   a chamber;
   a cathode and an opposite anode in the chamber;
   a target material positioned between the cathode and the anode in the chamber; and
   a supporting device positioned between the cathode and the anode in the chamber, the supporting device comprising:
   a rotatable device comprising four symmetrical restricting holes defined therein;
   a first driving device comprising a first driving body and a first shaft extending from the first driving body to rotate the rotatable device;
   at least four second driving devices, each second driving device comprising a second driving body and a second shaft extending from the second driving body, and each second shaft comprising a screw thread formed thereon;
   a hollow supporting plate configured for securing the workpiece; and
   four supporting poles, each supporting pole comprising a first end with a screw hole defined therein and an opposite second end fastened to the hollow supporting plate;
   wherein the four second shafts are threaded into the screw holes of the four supporting poles via the four restricting holes, correspondingly, the hollow supporting plate is movably fastened to the rotatable device, and a distance from the hollow supporting plate to the rotatable device is adjusted to align the workpiece with the target material by rotating the second shaft of each second driving device in the screw hole of the corresponding supporting pole when the hollow supporting plate is rotated together with the rotatable device.

2. The physical vapor deposition device of claim 1, wherein the target material is upright arranged between the cathode and the anode.

3. The physical vapor deposition device of claim 2, wherein one end of the target material is fastened to the top of the chamber over the rotatable device, and the other end of the target material passes through the hollow supporting plate.

4. The physical vapor deposition device of claim 3, wherein the target material extends along a direction perpendicular to the hollow supporting plate.

5. The physical vapor deposition device of claim 4, wherein the target material comprises an elongated cubic shape or a columnar shape.

6. The physical vapor deposition device of claim 1, wherein the hollow supporting plate is annular.

7. The physical vapor deposition device of claim 6, wherein the hollow supporting plate comprises a plurality of notches defined therein.

8. The physical vapor deposition device of claim 7, wherein the plurality of notches are arranged along a circumference of an internal sidewall of the hollow supporting plate and configured to receive the workpiece.

9. The physical vapor deposition device of claim 8, wherein a middle part of the workpiece is received in one of the plurality of notches.

10. The physical vapor deposition device of claim 9, wherein the workpiece comprises a first magnetic part with positive or negative polarity, and each of the plurality of notches of the hollow supporting plate comprises a second magnetic part with a reverse polarity.

11. The physical vapor deposition device of claim 1, wherein the rotatable device is disc-shaped and comprises a first surface and an opposite second surface, each restricting hole extends from the first surface to the second surface, and a center of the rotatable device is fastened to an end of the first shaft.

12. The physical vapor deposition device of claim 11, wherein the four second driving bodies are respectively aligned with the four restricting holes and fastened to the first surface of the rotatable device.

13. The physical vapor deposition device of claim 1, further comprising a vacuum device configured to vacuumize the chamber.

14. The physical vapor deposition device of claim 13, further comprising a gas supply device configured to introduce inert gases into the chamber.

15. The physical vapor deposition device of claim 14, further comprising a controller configured to control at least one of vacuumizing the chamber, introducing inert gases into the chamber, rotating the first shaft, and rotating the second shaft.

16. The physical vapor deposition device of claim 1, further comprising a power supply device configured for providing a high voltage across the cathode and the anode.

17. A physical vapor deposition device for coating a workpiece, comprising:
- a chamber;
- a cathode and an opposite anode in the chamber;
- a target material positioned between the cathode and the anode in the chamber;
- a rotatable device for supporting the target material and comprising four symmetrical restricting holes defined therein;
- a first driving device comprising a first driving body and a first shaft extending from the first driving body to rotate the rotatable device;
- at least four second driving devices, each second driving device comprising a second driving body and a second shaft extending from the second driving body, and each second shaft comprising a screw thread formed thereon;
- a hollow supporting plate configured for securing the workpiece; and
- four supporting poles, each supporting pole comprising a first end with a screw hole defined therein and an opposite second end fastened to the hollow supporting plate; wherein the four second shafts are threaded into the screw holes of the four supporting poles via the four restricting holes, correspondingly, and a distance from a first plane defined by the hollow supporting plate to a second plane defined by the rotatable device is adjusted by rotating the second shaft of each second driving device in the screw hole of the corresponding supporting pole.

* * * * *